(12) United States Patent
Meyer et al.

(10) Patent No.: US 10,211,182 B2
(45) Date of Patent: Feb. 19, 2019

(54) PACKAGE-ON-PACKAGE STACKED MICROELECTRONIC STRUCTURES

(71) Applicant: INTEL IP CORPORATION, Santa Clara, CA (US)

(72) Inventors: Thorsten Meyer, Regensburg (DE); Gerald Ofner, Regensburg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/649,104

(22) PCT Filed: Jul. 7, 2014

(86) PCT No.: PCT/US2014/045560
§ 371 (c)(1),
(2) Date: Jun. 2, 2015

(87) PCT Pub. No.: WO2016/007120
PCT Pub. Date: Jan. 14, 2016

(65) Prior Publication Data
US 2016/0260689 A1 Sep. 8, 2016

(51) Int. Cl.
*H01L 23/48* (2006.01)
*H01L 21/60* (2006.01)
(Continued)

(52) U.S. Cl.
CPC .......... *H01L 25/0657* (2013.01); *H01L 21/54* (2013.01); *H01L 23/3142* (2013.01);
(Continued)

(58) Field of Classification Search
CPC ... H01L 25/117; H01L 23/4012; H01L 25/00; H01L 23/53295; H01L 25/043;
(Continued)

(56) References Cited

U.S. PATENT DOCUMENTS 7,247,932 B1 * 7/2007 Lin .................... H01L 25/0657
257/528
7,364,945 B2 4/2008 Shim et al.
(Continued)

FOREIGN PATENT DOCUMENTS

CN 101983429 3/2011
CN 102543934 7/2012
(Continued)

OTHER PUBLICATIONS

International Search Report and Written Opinion received for PCT Patent Application No. PCT/US2014/045560, dated Mar. 31, 2015, 12 pages.
(Continued)

*Primary Examiner* — Mary Wilczewski
*Assistant Examiner* — Tsz Chu
(74) *Attorney, Agent, or Firm* — Schwabe, Williamson & Wyatt, P.C.

(57) ABSTRACT

A package-on-package stacked microelectronic structure comprising a pair of microelectronic packages attached to one another in a flipped configuration. In one embodiment, the package-on-package stacked microelectronic structure may comprise a first and a second microelectronic package, each comprising a substrate having at least one package connection bond pad formed on a first surface of each microelectronic package substrate, and each having at least one microelectronic device electrically connected to the each microelectronic package substrate first surface, wherein the first and the second microelectronic package are connected to one another with at least one package-to-package interconnection structure extending between the first microelectronic package connection bond pad and the second microelectronic package connection bond pad.

25 Claims, 7 Drawing Sheets

(51) Int. Cl.
*H01L 25/065* (2006.01)
*H01L 25/10* (2006.01)
*H01L 21/54* (2006.01)
*H01L 25/00* (2006.01)
*H05K 1/11* (2006.01)
*H01L 23/00* (2006.01)
*H01L 23/538* (2006.01)
*H01L 23/31* (2006.01)
*H01L 23/498* (2006.01)

(52) U.S. Cl.
CPC .... *H01L 23/3178* (2013.01); *H01L 23/49811* (2013.01); *H01L 25/065* (2013.01); *H01L 25/105* (2013.01); *H01L 25/50* (2013.01); H01L 23/3135 (2013.01); H01L 23/49838 (2013.01); H01L 23/5384 (2013.01); H01L 24/16 (2013.01); H01L 24/97 (2013.01); H01L 2224/0401 (2013.01); H01L 2224/04042 (2013.01); H01L 2224/131 (2013.01); H01L 2224/133 (2013.01); H01L 2224/1329 (2013.01); H01L 2224/16227 (2013.01); H01L 2224/32145 (2013.01); H01L 2224/32225 (2013.01); H01L 2224/48091 (2013.01); H01L 2224/48227 (2013.01); H01L 2224/73204 (2013.01); H01L 2224/73253 (2013.01); H01L 2224/81815 (2013.01); H01L 2224/92125 (2013.01); H01L 2225/0651 (2013.01); H01L 2225/06513 (2013.01); H01L 2225/06517 (2013.01); H01L 2225/06544 (2013.01); H01L 2225/06558 (2013.01); H01L 2225/1023 (2013.01); H01L 2225/1041 (2013.01); H01L 2225/1058 (2013.01); H01L 2924/1533 (2013.01); H01L 2924/15192 (2013.01); H01L 2924/15311 (2013.01); H01L 2924/15313 (2013.01); H01L 2924/15321 (2013.01); H01L 2924/15331 (2013.01); *H05K 1/11* (2013.01); H05K 2201/10515 (2013.01)

(58) Field of Classification Search
CPC ............... H01L 25/0657; H01L 25/074; H01L 25/0756; H01L 27/3209; H01L 2225/06513; H01L 2225/06517; H01L 23/488; H01L 24/01; H01L 2224/0401; H01L 25/0652; H01L 24/97; H01L 25/50; H01L 23/3128; H01L 21/561; H01L 22/22; H01L 24/14; H01L 24/16; H01L 24/32; H01L 24/48; H01L 24/73; H01L 24/81; H01L 24/92; H01L 23/5384; H01L 23/49816; H01L 23/49833; H01L 25/105; H01L 23/3737; H05K 2201/10515; H05K 1/0201; H05K 1/11; H05K 1/144; H05K 3/46

See application file for complete search history.

(56) References Cited

U.S. PATENT DOCUMENTS

| | | | |
|---|---|---|---|
| 8,399,980 B2 | 3/2013 | Ishihara et al. | |
| 9,349,708 B2* | 5/2016 | Fu | H01L 23/481 |
| 9,559,086 B2* | 1/2017 | Mei | H01L 25/18 |
| 9,947,625 B2* | 4/2018 | Lin | H01L 23/5389 |
| 2004/0125574 A1* | 7/2004 | Yoon | H01L 25/105 |
| | | | 361/735 |
| 2006/0055017 A1 | 3/2006 | Cho et al. | |
| 2008/0029884 A1* | 2/2008 | Grafe | H01L 23/5385 |
| | | | 257/723 |
| 2008/0272477 A1* | 11/2008 | Do | H01L 21/76898 |
| | | | 257/686 |
| 2009/0284947 A1* | 11/2009 | Beddingfield | H01L 23/49833 |
| | | | 361/818 |
| 2011/0068481 A1 | 3/2011 | Park et al. | |
| 2011/0117700 A1 | 5/2011 | Weng et al. | |
| 2012/0153471 A1 | 6/2012 | Watanabe et al. | |
| 2013/0043587 A1* | 2/2013 | Kao | H01L 24/11 |
| | | | 257/738 |
| 2014/0145323 A1 | 5/2014 | Lee et al. | |
| 2014/0147972 A1* | 5/2014 | Semmelmeyer | H01L 25/0652 |
| | | | 438/109 |

FOREIGN PATENT DOCUMENTS

| | | |
|---|---|---|
| JP | 2002-43505 | 2/2002 |
| JP | 2004-354138 A | 12/2004 |
| JP | 2004-356138 A | 12/2004 |
| JP | 2007-067053 A | 3/2007 |
| JP | 2009-246104 A | 10/2009 |
| JP | 2012-129452 A | 7/2012 |
| JP | 2014-107554 A | 6/2014 |
| KR | 10-2008-0069512 | 7/2006 |
| KR | 10-2008-0069512 | 7/2008 |
| KR | 10-2011-0016028 | 2/2011 |
| KR | 10-2014-0067359 | 6/2014 |

OTHER PUBLICATIONS

Non Final Notice of Reasons Rejection (4 pages) dated Jan. 17, 2017 for from the Japanese Patent Office for Japanese Patent Application No. 2016-533300 and English Translation (3 pages)thereof.
Taiwan Notice of Allowance for TW Application No. 104118154, dated Mar. 5, 2017, with English Translation, 3 pages.
EP Communication Pursuant to Rules 161(2) and P162 EPC for Application No. EP 14870668.2, dated Mar. 31, 2017, 2 pages.
International Preliminary Report on Patentability for International Patent Application No. PCT/US2014/045560 dated Jan. 19, 2017, 9 pgs.
1st Office Action for Chinese Patent Application No. 201480003741.3 dated Aug. 9, 2017, 9 pgs., no English translation.
Notice of Reasons for Rejection for Japanese Patent Application No. 2016-533300 dated Sep. 6, 2016, 6 pgs., with English translation.
Notice of Decision of Refusal for Japanese Patent Application No. 2016-533300 dated Jul. 25, 2017, 2 pgs., with computer translation in English.
Notice of Decision to Decline the Amendment for Japanese Patent Application No. 2016-533300 dated Jul. 25, 2017, 7 pgs., with computer translation in English.
Search Report and Written Opinion for European Patent Application No. 14870668.2, dated Sep. 14, 2017, 8 pages.
Office Action from Chinese Patent Application No. 201480003741.3, dated Apr. 25, 2018, 7 pages.
Notice of Allowance for Korean Patent Application No. 10-2015-7017180, dated Feb. 10, 2017, 3 pages.
Office Action for Japanese Patent Application No. 2016-533300, dated Feb. 8, 2018, 12 pages.
Official Letter along with Search Report from the IP Office for Taiwan Patent Application No. 104118154 dated Jun. 4, 2016.
Notice of Preliminary Rejection (8 pages) dated Aug. 23, 2016 from the Korean Intellectual Property Office for Korean Patent Application No. 2015-7017180 and English Translation (8 pages) thereof.
Notice of Reasons for Rejection (3 pages) dated Sep. 11, 2016 from the Japanese Patent Office for Japanese Patent Application No. 2016-533300 and English Translation (3 pages) thereof.

* cited by examiner

PACKAGE-ON-PACKAGE STACKED MICROELECTRONIC STRUCTURES

CROSS REFERENCE TO RELATED APPLICATIONS

This application is a U.S. National Phase application under 35 U.S.C. § 371 of International Application No. PCT/US2014/045560, filed on Jul. 7, 2014, the entire contents of which are hereby incorporated by reference herein.

TECHNICAL FIELD

Embodiments of the present description generally relate to the field of microelectronic package fabrication, and, more particularly, to a microelectronic structure including two microelectronic packages stacked in a flipped configuration.

BACKGROUND

The microelectronic industry is continually striving to produce ever faster and smaller microelectronic packages for use in various electronic products, including, but not limited to, computer server products and portable products, such as portable computers, electronic tablets, cellular phones, digital cameras, and the like. One route to achieve these goals is the fabrication of stacked packages. On type of package stacking, called Package-on-Package (PoP) stacking, is becoming an important solution for mobile and wireless applications that require small lateral dimensions, low package heights, and high bandwidth between the microelectronic devices within the Package-on-Package stacked structure.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
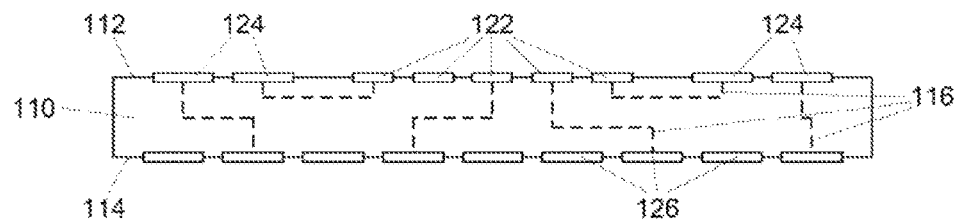
FIGS. 1-7 illustrates cross-sectional views of processes of fabricating a package-on-package stacked microelectronic structure, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include a package-on-package stacked microelectronic structure comprising a pair of microelectronic packages attached to one another in a flipped configuration. In one embodiment, the package-on-package stacked microelectronic structure may comprise a first and a second microelectronic package, each comprising a substrate having at least one package connection bond pad formed on a first surface of each microelectronic package substrate, and each having at least one microelectronic device electrically connected to the each microelectronic package substrate first surface, wherein the first and the second microelectronic package are connected to one another with at least one package-to-package interconnection structure extending between the first microelectronic package connection bond pad and the second microelectronic package connection bond pad.

FIGS. 1-7 illustrate embodiments of the present description wherein a pair of microelectronic packages are attached to one another in a flipped configuration to form a package-on-package stacked microelectronic structure. As shown in FIG. 1, a package substrate 110 may be formed. The package substrate 110 may be any appropriate substrate, such as an interposer or the like, having a first surface 112 and an opposing second surface 114. The package substrate 110 may have a plurality of bond pads, comprising at least one microelectronic device attachment bond pad 122 and at least one package-to-package bond pads 124, formed in or on the package substrate first surface 112, and a plurality of external connection bond pads 126 formed in or on the package substrate second surface 114. The package substrate 110 may comprise a plurality of dielectric layers (not illustrated) having a plurality of conductive routes 116 formed therethrough, wherein the conductive routes 116 may form connections between appropriate bond pads, such as the microelectronic device attachment bond pads 122, the package-to-package bond pads 124, and/or the external connection bond pads 126.

The package substrate 110 may comprise any appropriate dielectric material, including, by not limited to, liquid crystal polymer, epoxy resin, bismaleimide triazine resin, FR4, polyimide materials, and the like. The conductive routes 116 may be formed of any appropriate conductive material, including, but not limited to, copper, silver, gold, nickel, and alloys thereof. It is understood that the package substrate 110 may be formed from any number of dielectric layers, may contain a rigid core (not shown), and may contain active and/or passive microelectronic devices (not shown) formed therein. It is further understood that the conductive routes 116 could form any desired electrical route within the package substrate 110 and/or with additional external components (not shown). It is also understood that solder resist layers (not shown) could be utilized on the package substrate first surface 112 and/or the package substrate second surface 114, as will be understood to those skilled in the art. The processes used for forming the package substrate 110 are well known to those skilled in the art, and for the sake of brevity and conciseness will not be described or illustrated herein.

Figure 2:
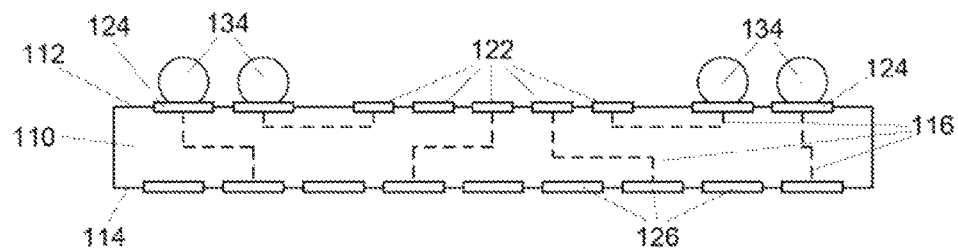

As shown in FIG. 2, a package interconnection material bump 134 may be formed on each of the package-to-package bond pads 124. The package interconnection material bumps 134 may be formed from any appropriate material, including, but not limited to, reflowable solder.

Figure 3:
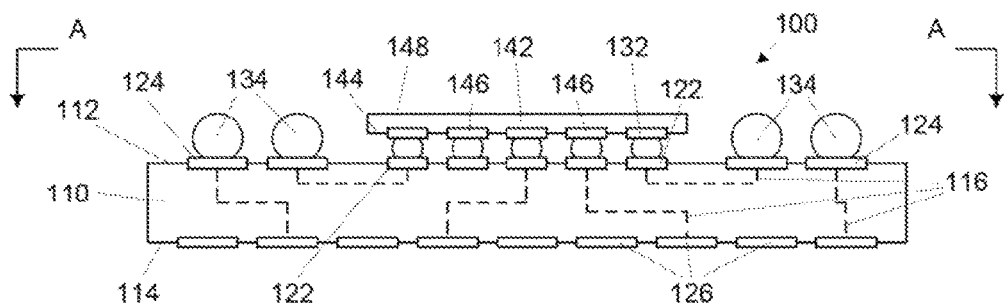

As shown in FIG. 3, a microelectronic device 142 having an active surface 144 and an opposing back surface 148 may be attached to corresponding microelectronic device attachment bond pads 122 with a plurality of device-to-substrate interconnects 132, in a configuration generally known as a flip-chip or controlled collapse chip connection ("C4") configuration, to form a microelectronic package 100. The device-to-substrate interconnects 132 may extend between the microelectronic device attachment bond pads 122 and mirror-image bond pads 146 on an active surface 144 of the microelectronic device 142 to form an electrical connection therebetween. It is understood that the microelectronic device bond pads 146 may be in electrical communication with integrated circuitry (not shown) within the microelectronic device 142. The microelectronic device 142 may be any appropriate microelectronic device, including, but not limited to a microprocessor, a chipset, a graphics device, a wireless device, a memory device, an application specific integrated circuit device, and the like.

The device-to-substrate interconnects 132 can be made any appropriate material, including, but not limited to, solders and conductive filled epoxies. Solder materials may include may be any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the microelectronic device 142 is attached to the microelectronic substrate 110 with device-to-substrate interconnects 132 made of solder, the solder is reflowed, either by heat, pressure, and/or sonic energy to secure the solder between the microelectronic device bond pads 146 and the microelectronic device attachment bond pads 122. Additionally, the microelectronic device 142 may be copper pillar based flip chip component which is attached to the substrate 110, as will be understood to those skilled in the art.

Figure 4:
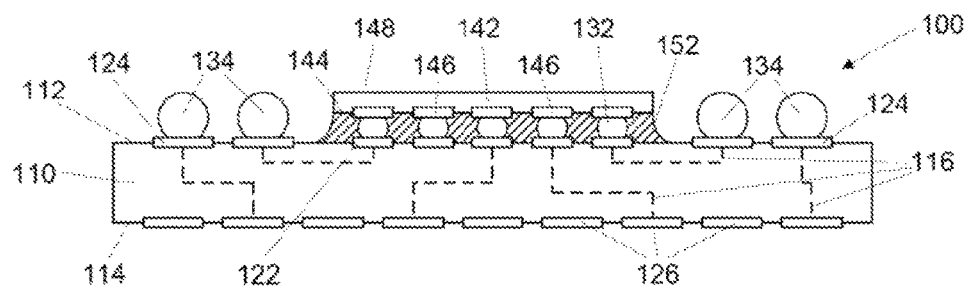

As shown in FIG. 4, an electrically-insulating flowable material, such as an underfill material 152 may be disposed between the microelectronic device 142 and the package substrate 110, which substantially encapsulates the device-to-substrate interconnects 132. The underfill material 152 may be used to reduce mechanical stress issues that can arise from thermal expansion mismatch between the microelectronic device 142 and the microelectronic substrate 110. The underfill material 152 may be an epoxy material, including, but not limited to epoxy, cyanoester, silicone, siloxane and phenolic based resins, that has sufficiently low viscosity to be wicked between the microelectronic device 142 and the microelectronic substrate 110 by capillary action when introduced by an underfill material dispenser (not shown), which will be understood to those skilled in the art. The underfill material 152 may be subsequently cured (hardened), such as by heat or radiation. The underfill material 152 may also be a molded material (molded underfill) or similar encapsulation material, which is underfilling and covering the microelectronic device 142 at the same time and is applied in a molding step, as will be discussed.

Figure 5:
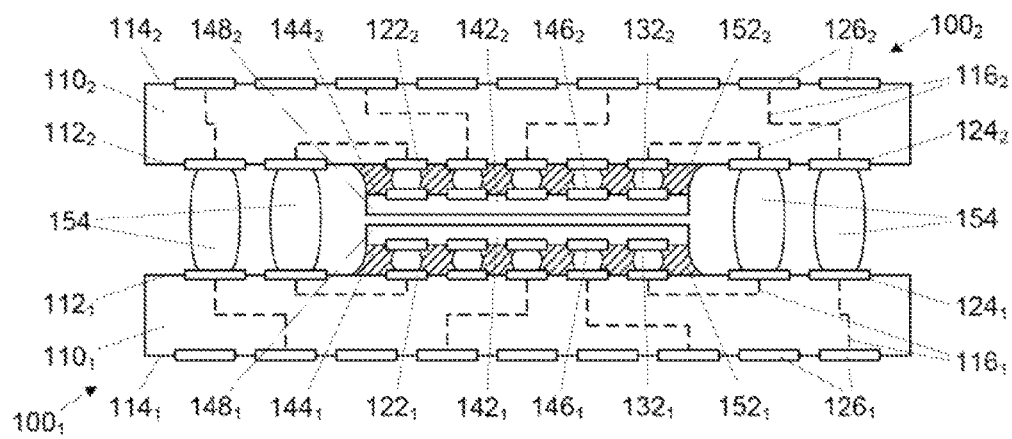

As shown in FIG. 5, a pair of microelectronic packages, illustrated as first microelectronic package $100_1$ and second microelectronic package $100_2$, may be placed in a substantially mirrored position, wherein the first microelectronic package substrate first surface $112_1$ faces the second microelectronic package substrate first surface $112_2$, and the package interconnection material bumps (see elements 134 of FIG. 4) of each of the first microelectronic package $100_1$ and the second microelectronic package $100_2$ attach to one another to form package-to-package interconnection structures 154. The package-to-package interconnection structures 154 may provide electrical communication routes between the first microelectronic package $100_1$ and the second microelectronic package $100_2$. It is noted the like components for the first microelectronic package $100_1$ and the second microelectronic package $100_2$ with regard to the components of FIGS. 1-4 are denoted with subscript "1" and subscript "2", respectively.

The package interconnection material bumps (see elements 134 of FIG. 4) can be made any appropriate material, including, but not limited to, solders and conductive filled epoxies. Solder materials may include may be any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the first microelectronic package $100_1$ and the second microelectronic package $100_2$ attach to one another with package interconnection material bumps 134 that are made of solder, the solder is reflowed, either by heat, pressure, and/or sonic energy such that corresponding interconnection material bumps of the first microelectronic package $100_1$ and the second microelectronic package $100_2$ combine to form package-to-package interconnection structures 154.

Figure 6:
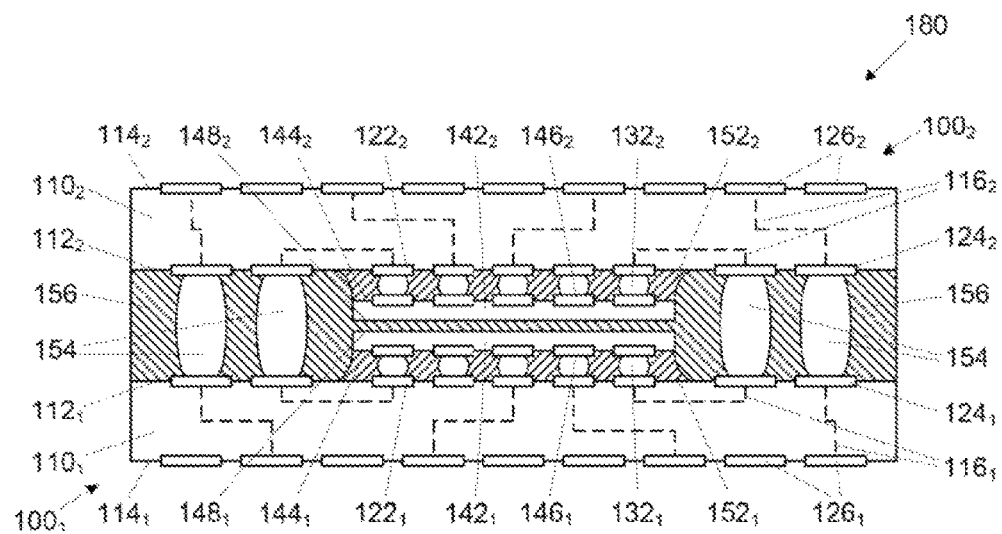

As shown in FIG. 6, an encapsulation material 156 may be disposed between the first microelectronic package $100_1$ and the second microelectronic package $104_2$ to form a package-on-package stacked microelectronic structure 180. The encapsulation material 156 may be any appropriate material, such as an epoxy resin, and may provide structural rigidity to the package-on-package stacked microelectronic structure 180, wherein the encapsulation material 156 substantially surrounds the package-to-package interconnection structures 154, the first microelectronic device $142_1$, and the second microelectronic device $142_2$.

Figure 7:
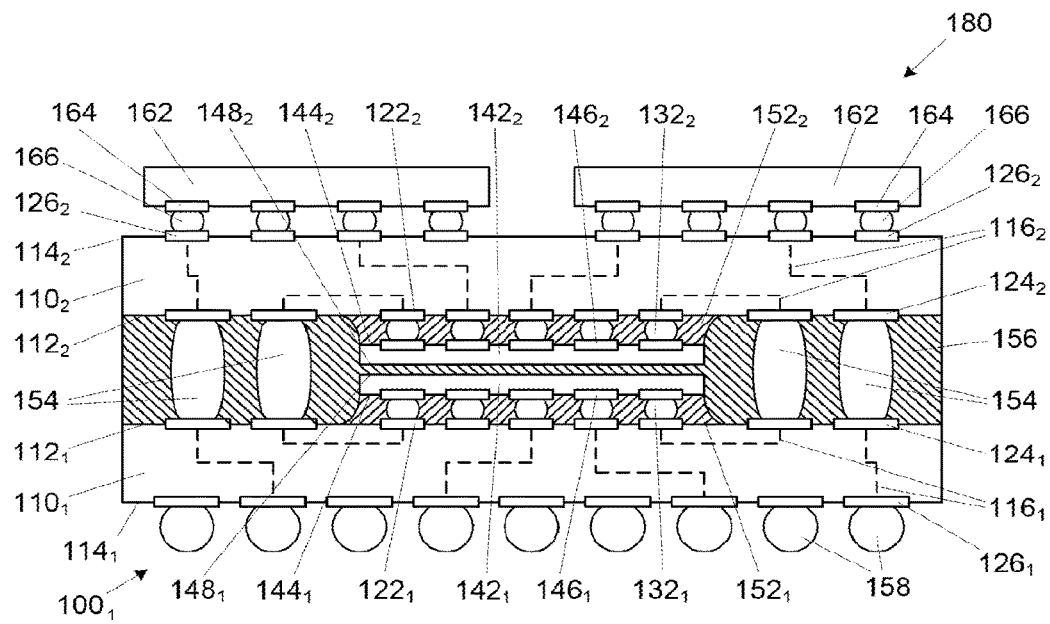

As shown in FIG. 7, a variety of additional components may be a part of the package-on-package stacked microelectronic structure 180. As illustrated, external interconnects 158 may be attached to the first microelectronic package external connection bond pads $126_1$ for connecting the package-on-package stacked microelectronic structure 180 to external structures (not shown), such as a motherboard. Furthermore, additional microelectronic devices may be a part of the package-on-package stacked microelectronic structure 180, such as additional microelectronic device 162 attached by additional device interconnects 166 extending between bond pads 164 of the additional microelectronic devices 162 and the second microelectronic package external connection bond pads $126_2$.

Figure 8:
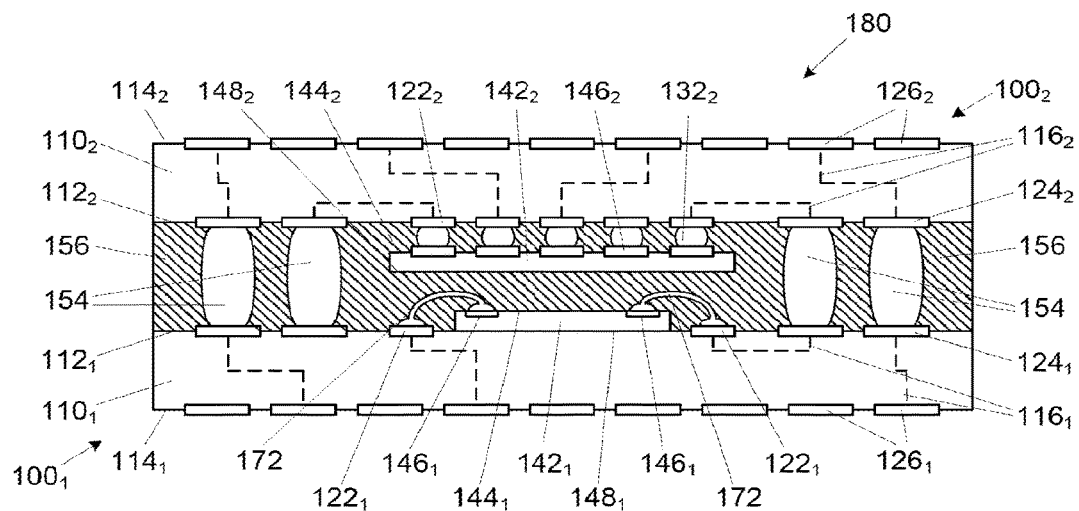
FIG. 8 illustrates a cross-sectional view of a package-on-package stacked microelectronic structure, according to another embodiment of the present description.
Figure 9:
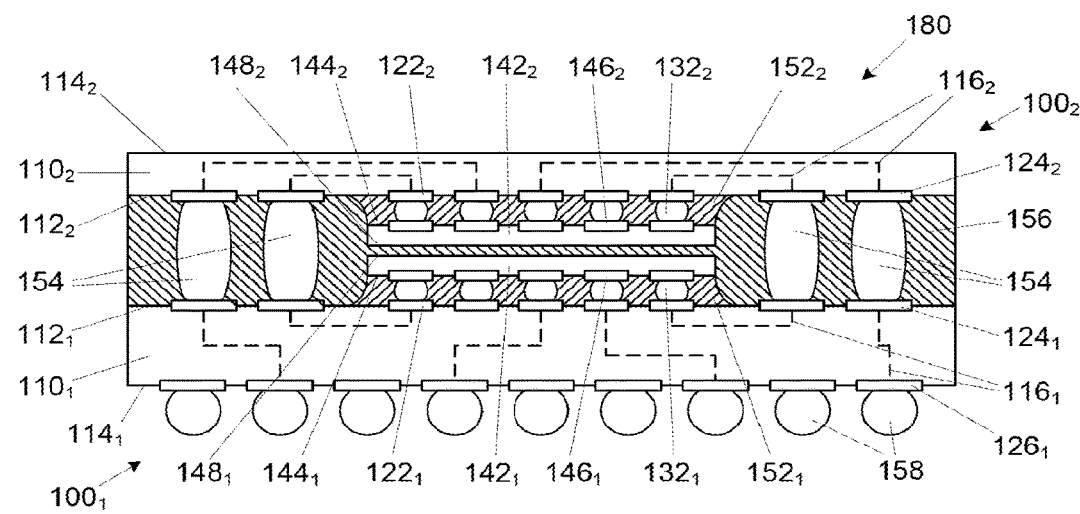
FIG. 9 illustrates a cross-sectional view of a package-on-package stacked microelectronic structure, according to still another embodiment of the present description.
Figure 10:
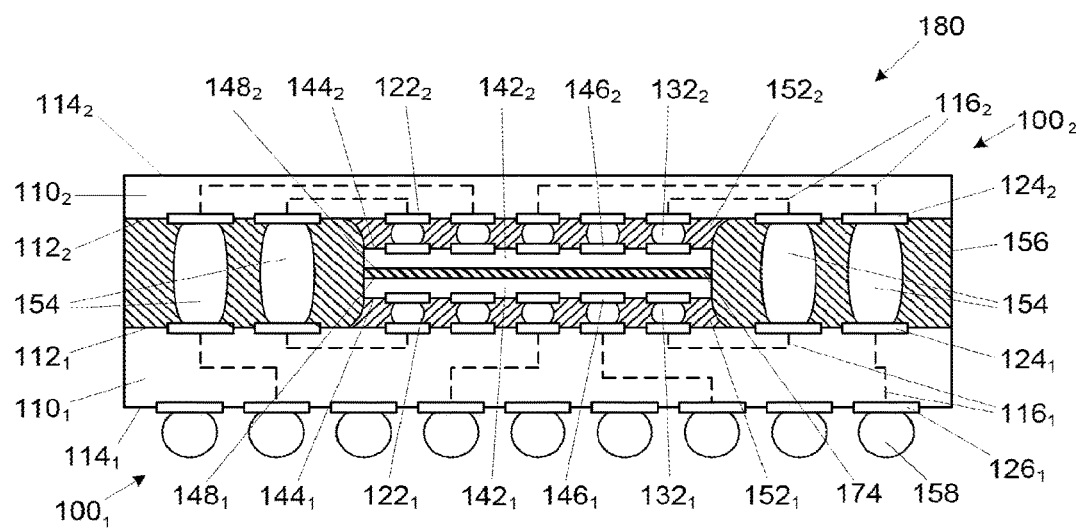
FIG. 10 illustrates a cross-sectional view of a package-on-package stacked microelectronic structure, according to yet another embodiment of the present description.

It is understood that the subject matter of the present description is not limited to the structures illustrated in FIGS. 1-7. For example, as shown in FIG. 8, the microelectronic devices need not be attached by flip-chip attachment; rather, for example, the first microelectronic device back surface $148_1$ may be attached to the first microelectronic package substrate first surface $112_1$ and bond wires 172 may be formed between the first microelectronic package microelectronic device bond pads $146_1$ and the first microelectronic package substrate microelectronic device attachment bond pads $122_1$. Further, the underfill material (illustrated as first underfill material $152_1$ and/or second underfill material $152_2$ of FIG. 7) may not be necessary when the encapsulation material 156 is of sufficiently low viscosity to flow between the microelectronic device and the substrate, such as shown in FIG. 7 between the second microelectronic package microelectronic device $142_2$ and the second microelectronic package substrate $110_2$ (e.g. a molded underfill material). Moreover, one of the substrates (e.g. elements $110_1$ and $110_2$) may be single sided substrate (e.g. bond pads only on one surface), such as a flex tape (e.g. polyimide), a mold body with a redistribution layer, a ceramic material, a laminate, or any other appropriate single side substrate, such as illustrated for second microelectronic package substrate $110_2$ in FIG. 9. In another embodiment, the first microelectronic package microelectronic device back surface $148_1$ may be attached to the second microelectronic package microelectronic device back surface $148_2$ with an adhesive material 174 prior to disposing the encapsulation material 156, as illustrated in FIG. 10.

Figure 11:
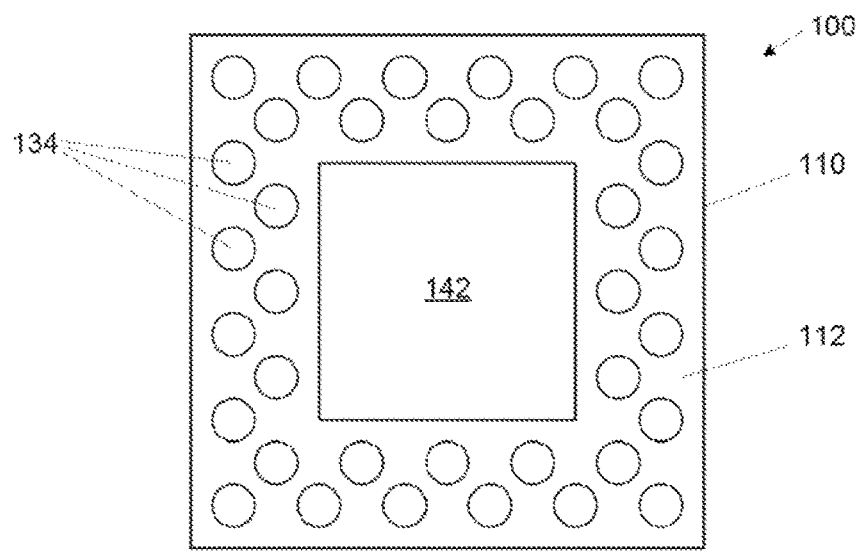
FIG. 11 illustrates a top plan view along line A-A of FIG. 3, according to one embodiment of the present description.
Figure 12:
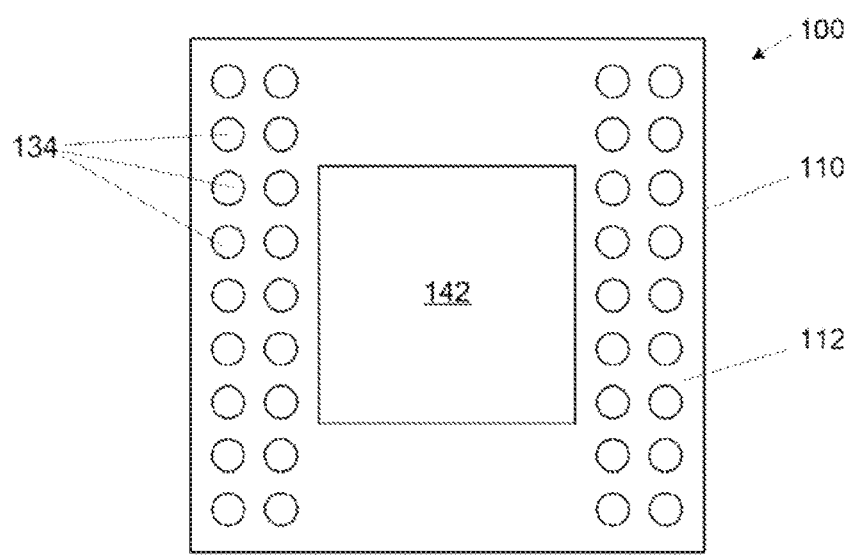
FIG. 12 illustrates a top plan view along line A-A of FIG. 3, according to another embodiment of the present description

As shown in FIG. 11, which is a top plan view along line A-A of FIG. 3, the arrangement of the package interconnection material bumps 134 may be such that they substantially surround the microelectronic device 142. In other embodiment shown in FIG. 12, the package interconnection material bumps 134 may be arranged on opposing sides of the microelectronic device 142. It is understood that the arrangements of the package interconnection material bumps 134 in FIGS. 11 and 12 are merely exemplary and any appropriate arrangement may be employed.

Figure 13:
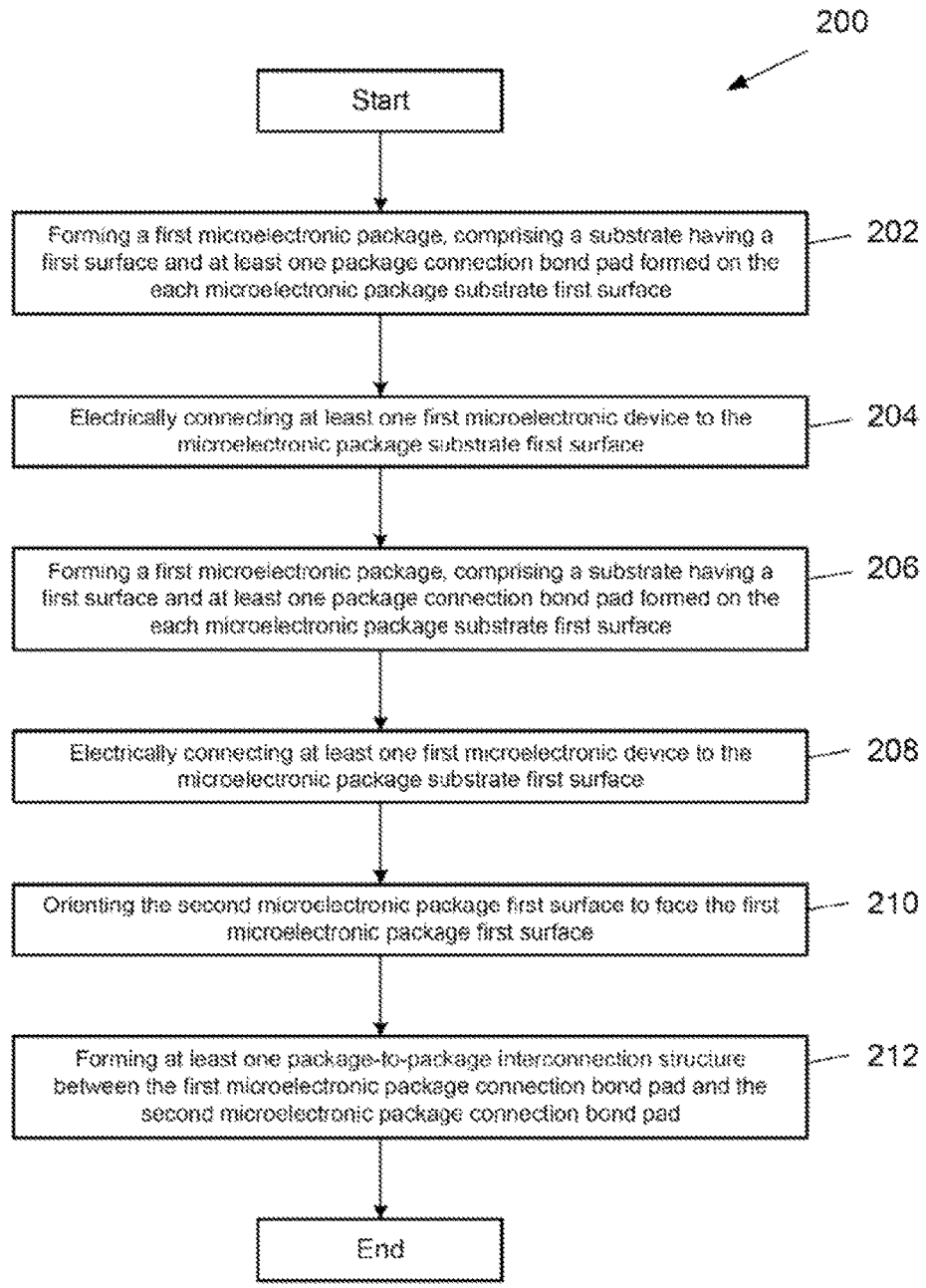
FIG. 13 is a flow chart of a process of fabricating a package-on-package stacked microelectronic structure, according to an embodiment of the present description.

FIG. 13 is a flow chart of a process 200 of fabricating a microelectronic structure according to an embodiment of the present description. As set forth in block 202, a first microelectronic package may be formed, comprising a substrate having a first surface and at least one package connection bond pad formed on the each microelectronic package substrate first surface. At least one first microelectronic device may be electrically connected to the microelectronic package substrate first surface, as set forth in block 204. As set forth in block 206, a second microelectronic package may be formed, comprising a substrate having a first surface and at least one package connection bond pad formed on the each microelectronic package substrate first surface. At least one second microelectronic device may be electrically connected to the microelectronic package substrate first surface, as set in block 208. As set forth in block 210, the second microelectronic package first surface may be oriented to face the first microelectronic package first surface. At least one package-to-package interconnection structure may be formed between the first microelectronic package connection bond pad and the second microelectronic package connection bond pad, as set forth in block 212.

Figure 14:
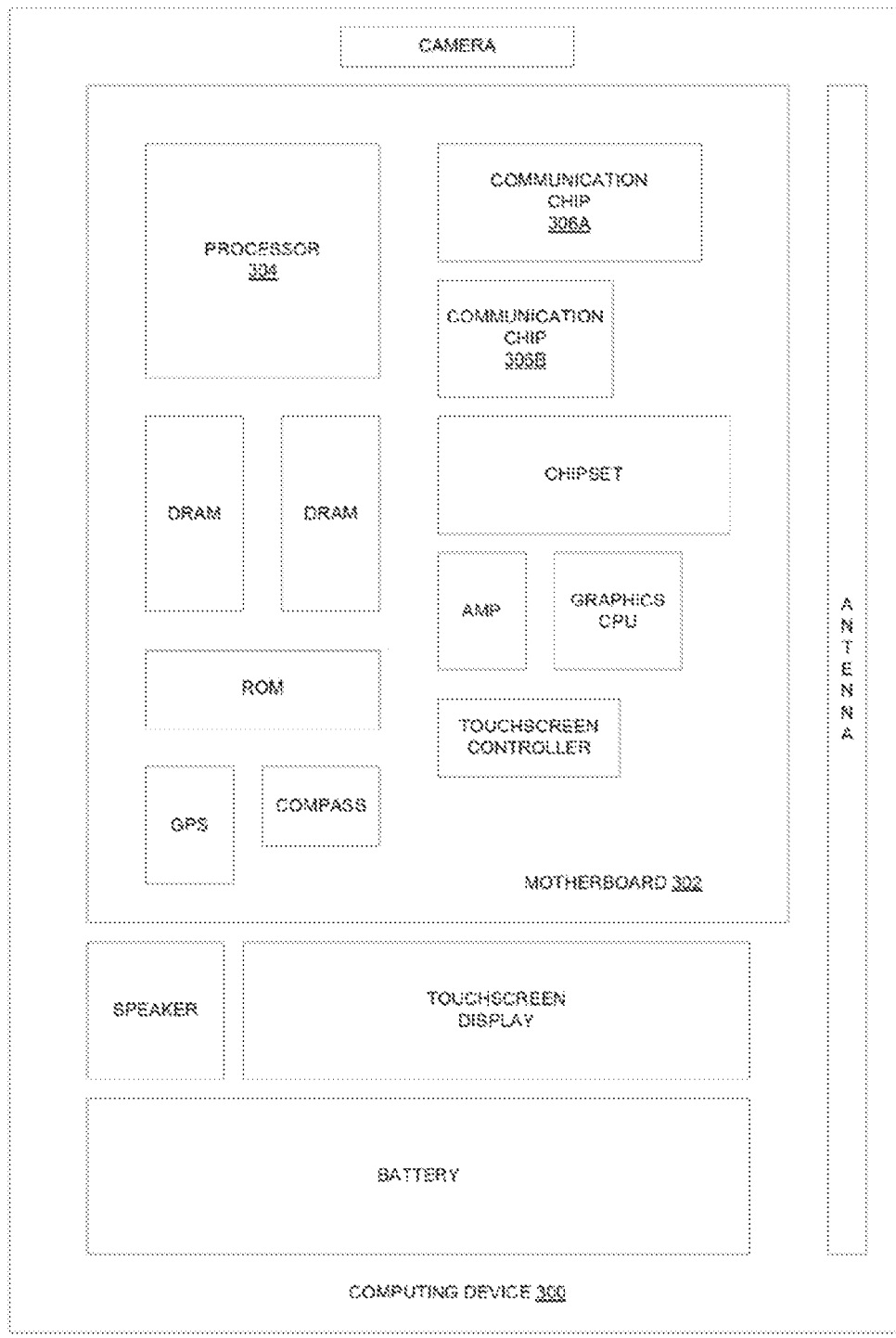
FIG. 14 illustrates a computing device in accordance with one implementation of the present description.

FIG. 14 illustrates a computing device 300 in accordance with one implementation of the present description. The computing device 300 houses a board 302. The board 302 may include a number of components, including but not limited to a processor 304 and at least one communication chip 306A, 306B. The processor 304 is physically and electrically coupled to the board 302. In some implementations the at least one communication chip 306A, 306B is also physically and electrically coupled to the board 302. In further implementations, the communication chip 306A, 306B is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306A, 306B enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306A, 306B. For instance, a first communication chip 306A may be dedicated to shorter range wireless communications such as Wi-Fi and Bluetooth and a second communication chip 306B may be dedicated to longer range wireless communications such as GPS EDGE, GPRS, CDMA, WiMAX, LTE, Ev-DO, and others.

The processor 304 of the computing device 300 may be included in a package-on-package stacked microelectronic structure, as described above. The term "processor" may refer to any device or portion of a device that processes electronic data from registers and/or memory to transform that electronic data into other electronic data that may be stored in registers and/or memory. Furthermore, the communication chip 306A, 306B may be included in a package-on-package stacked microelectronic structure, as described above.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-14. The subject matter may be applied to other microelectronic devices and assembly applications, as well as any appropriate electronic application, as will be understood to those skilled in the art.

The following examples pertain to further embodiments. Specifics in the examples may be used anywhere in one or more embodiments.

In Example 1, a package-on-package stacked microelectronic structure may comprise a first microelectronic package, comprising a substrate having a first surface and at least one package connection bond pad formed on the microelectronic package substrate first surface, and having at least one microelectronic device electrically connected to the microelectronic package substrate first surface; a second microelectronic package, comprising a substrate having a first surface and at least one package connection bond pad formed on the each microelectronic package substrate first surface, and having at least one microelectronic device electrically connected to the microelectronic package substrate first surface; and at least one package-to-package interconnection structure extending between the first microelectronic package connection bond pad and the second microelectronic package connection bond pad.

In Example 2, the subject matter of Example 1 can optionally include an encapsulation material disposed between the first microelectronic package substrate first surface and the second microelectronic package substrate first surface.

In Example 3, the subject matter of Example 1 or 2 can optionally include at least one of the first microelectronic package microelectronic device and the second microelectronic package microelectronic device being attached to its respective substrate with a plurality of interconnects in a flip-chip configuration.

In Example 4, the subject matter of Example 3 can optionally include at least one of a first underfill material disposed between the first microelectronic package microelectronic device and the first microelectronic package substrate, and a second underfill material disposed between the second microelectronic package microelectronic device and the second microelectronic package substrate.

In Example 5, the subject matter of Examples 1 to 2 can optionally include at least one of the first microelectronic package microelectronic device and the second microelectronic package microelectronic device is attached to its respective substrate with a plurality of wirebonds.

In Example 6, the subject matter any of Examples 1 to 4 can optionally include a back surface of the first microelectronic package microelectronic device being attached to a back surface of the second microelectronic package microelectronic device with an adhesive material.

In Example 7, the subject matter of any of Examples 1 to 6 can optionally include the first microelectronic package substrate including a second surface and the second microelectronic package substrate including a second surface, and further including a plurality of external bond pads in or on at least one of the first microelectronic package substrate second surface and the second microelectronic package substrate second surface.

In Example 8, a method of forming a package-on-package stacked microelectronic structure may comprise forming a first microelectronic package, comprising a substrate having a first surface and at least one package connection bond pad formed on the each microelectronic package substrate first surface; electrically connecting at least one first microelectronic device to the microelectronic package substrate first surface; forming a second microelectronic package, comprising a substrate having a first surface and at least one package connection bond pad formed on the each microelectronic package substrate first surface; electrically connecting at least one second microelectronic device to the microelectronic package substrate first surface; orienting the second microelectronic package first surface to face the first microelectronic package first surface; and forming at least one package-to-package interconnection structure between the first microelectronic package connection bond pad and the second microelectronic package connection bond pad.

In Example 9, the subject matter of Example 8 can optionally include forming at least one package-to-package interconnection structure between the first microelectronic package connection bond pad and the second microelectronic package connection bond pad comprising forming a package interconnection material bump on its respective first microelectronic package connection bond pad, forming a package interconnection material bump on the second microelectronic package connection bond pad, and attaching the first microelectronic package interconnection material bump with the second microelectronic package interconnection material bump.

In Example 10, the subject matter of Example 9 can optionally include forming the package interconnection material bump on its respective first microelectronic package connection bond pad, forming the package interconnection material bump on the second microelectronic package connection bond pad, and attaching the first microelectronic package interconnection material bump with the second microelectronic package interconnection material bump comprising forming a package interconnection solder bump on its respective first microelectronic package connection bond pad, forming the package interconnection solder bump on the second microelectronic package connection bond pad, and reflowing the first microelectronic package interconnection solder bump with the second microelectronic package interconnection solder bump.

In Example 11, the subject matter of any of Examples 8 to 10 can optionally include disposing an encapsulation material between the first microelectronic package substrate first surface and the second microelectronic package substrate first surface.

In Example 12, the subject matter of any of Examples 8 to 11 can optionally include electrically connecting the first microelectronic device to the microelectronic package substrate first surface comprising electrically connecting the first microelectronic device to the first microelectronic package substrate first surface with a plurality of interconnects in a flip-chip configuration.

In Example 13, the subject matter of Example 12 can optionally include disposing a first underfill material between the first microelectronic package microelectronic device and the first microelectronic package substrate.

In Example 14, the subject matter of any of Example 8 to 13 can optionally include electrically connecting the second microelectronic device to the microelectronic package substrate first surface comprising electrically connecting the second microelectronic device to the second microelectronic package substrate first surface with a plurality of interconnects in a flip-chip configuration.

In Example 15, the subject matter of Example 14 can optionally include disposing a second underfill material between the second microelectronic package microelectronic device and the second microelectronic package substrate.

In Example 16, the subject matter of Example 8 can optionally include at least one of electrically connecting the first microelectronic device to the microelectronic package substrate first surface and electrically connecting the second microelectronic device to the microelectronic package substrate comprises at least one of electrically connecting the first microelectronic device to the first microelectronic package substrate first surface with a plurality of wirebonds and electrically connecting the second microelectronic device to the second microelectronic package substrate first surface with a plurality of wirebonds.

In Example 17, the subject matter of Example 8 can optionally include attaching a back surface of the first microelectronic package microelectronic device to attached to a back surface of the second microelectronic package microelectronic device with an adhesive material.

In Example 18, the subject matter of any of Examples 8 to 17 can optionally include the first microelectronic package substrate including a second surface and the second microelectronic package substrate including a second surface, and further including forming a plurality of external bond pads in or on at least one of the first microelectronic package substrate second surface and the second microelectronic package substrate second surface.

In Example 19, a computing device may comprise a board; and a package-on-package stacked microelectronic structure attached to the board, wherein the package-on-package stacked microelectronic structure comprising a first microelectronic package, comprising a substrate having a first surface and at least one package connection bond pad formed on the microelectronic package substrate first surface, and having at least one microelectronic device electrically connected to the microelectronic package substrate first surface; a second microelectronic package, comprising a substrate having a first surface and at least one package connection bond pad formed on the each microelectronic package substrate first surface, and having at least one microelectronic device electrically connected to the microelectronic package substrate first surface; and at least one package-to-package interconnection structure extending between the first microelectronic package connection bond pad and the second microelectronic package connection bond pad.

In Example 20, the subject matter of Example 19 can optionally include an encapsulation material disposed between the first microelectronic package substrate first surface and the second microelectronic package substrate first surface.

In Example 21, the subject matter of Examples 19 or 20 can optionally include at least one of the first microelectronic package microelectronic device and the second microelectronic package microelectronic device being attached to its respective substrate with a plurality of interconnects in a flip-chip configuration.

In Example 22, the subject matter of Example 21 can optionally include at least one of a first underfill material disposed between the first microelectronic package microelectronic device and the first microelectronic package substrate, and a second underfill material disposed between the second microelectronic package microelectronic device and the first microelectronic package substrate.

In Example 23, the subject matter of Example 19 or 20 can optionally include at least one of the first microelectronic package microelectronic device and the second microelectronic package microelectronic device being attached to its respective substrate with a plurality of wirebonds.

In Example 24, the subject matter of Example 19 can optionally include a back surface of the first microelectronic package microelectronic device attached to a back surface of the second microelectronic package microelectronic device with an adhesive material.

In Example 25, the subject matter of any of Examples 19 to 24 can optionally include the first microelectronic package substrate including a second surface and the second microelectronic package substrate including a second surface, and further including a plurality of external bond pads in or on at least one of the first microelectronic package substrate second surface and the second microelectronic package substrate second surface.

Having thus described in detail embodiments of the present description, it is understood that the present description defined by the appended claims is not to be limited by particular details set forth in the above description, as many apparent variations thereof are possible without departing from the spirit or scope thereof.

The invention claimed is:

1. A package-on-package stacked microelectronic structure, comprising:
 a first microelectronic package, comprising a substrate having a first surface and a second surface opposite the first surface, and at least one package connection bond pad formed on the microelectronic package substrate first surface, and having at least one microelectronic device electrically connected to the first microelectronic package substrate first surface;
 a second microelectronic package, comprising a substrate having a first surface and a second surface opposite the first surface, and at least one package connection bond pad formed on each second microelectronic package substrate first surface, and having at least one microelectronic device electrically connected to the second microelectronic package substrate first surface, and having at least two microelectronic devices electrically connected to the second microelectronic package substrate second surface, the at least two microelectronic devices co-planar with one another on the second microelectronic package substrate second surface, and the at least two microelectronic devices electrically coupled to the at least one microelectronic device of the second microelectronic package by conductive routes through the second microelectronic package substrate, wherein a first of the conductive routes couples a first microelectronic device of the at least two microelectronic devices to a microelectronic device of the at least one microelectronic device, and a second of the conductive routes couples a second microelectronic device of the at least two microelectronic devices to the microelectronic device of the at least one microelectronic device; and at least one package-to-package interconnection structure extending between the first microelectronic package connection bond pad and the second microelectronic package connection bond pad.

2. The package-on-package stacked microelectronic structure of claim 1, further including an encapsulation material disposed between the first microelectronic package substrate first surface and the second microelectronic package substrate first surface.

3. The package-on-package stacked microelectronic structure of claim 1, wherein at least one of the first microelectronic package microelectronic device and the second microelectronic package microelectronic device is attached to its respective substrate with a plurality of interconnects in a flip-chip configuration.

4. The package-on-package stacked microelectronic structure of claim 3, further including at least one of a first underfill material disposed between the first microelectronic package microelectronic device and the first microelectronic package substrate, and a second underfill material disposed between the second microelectronic package microelectronic device and the second microelectronic package substrate.

5. The package-on-package stacked microelectronic structure of claim 1, wherein at least one of the first microelectronic package microelectronic device and the second microelectronic package microelectronic device is attached to its respective substrate with a plurality of wirebonds.

6. The package-on-package stacked microelectronic structure of claim 1, wherein a back surface of the first microelectronic package microelectronic device is attached to a back surface of the second microelectronic package microelectronic device with an adhesive material.

7. The package-on-package stacked microelectronic structure of claim 1, wherein the first microelectronic package substrate includes a second surface and the second microelectronic package substrate includes a second surface, and further including a plurality of external bond pads in or on at least one of the first microelectronic package substrate second surface and the second microelectronic package substrate second surface.

8. A method of forming a package-on-package stacked microelectronic structure, comprising:
forming a first microelectronic package, comprising a substrate having a first surface and at least one package connection bond pad formed on each microelectronic package substrate first surface; electrically connecting at least one first microelectronic device to the microelectronic package substrate first surface;
forming a second microelectronic package, comprising a substrate having a first surface and at least one package connection bond pad formed on each microelectronic package substrate first surface;

electrically connecting at least one second microelectronic device to the second microelectronic package substrate first surface;
electrically connecting at least one third microelectronic device and one fourth microelectronic device to the second microelectronic package substrate second surface, the at least one third and one fourth microelectronic devices co-planar with one another on the second microelectronic package substrate second surface, and the at least one third and one fourth microelectronic devices electrically coupled to the at least one second microelectronic device of the second microelectronic package by conductive routes through the second microelectronic package substrate, wherein a first of the conductive routes couples a first microelectronic device of the at least one third and one fourth microelectronic devices to a microelectronic device of the at least one second microelectronic device, and a second of the conductive routes couples a second microelectronic device of the at least one third and one fourth microelectronic devices to the microelectronic device of the at least one second microelectronic device;
orienting the second microelectronic package first surface to face the first microelectronic package first surface; and
forming at least one package-to-package interconnection structure between the first microelectronic package connection bond pad and the second microelectronic package connection bond pad.

9. The method of claim 8, wherein forming at least one package-to-package interconnection structure between the first microelectronic package connection bond pad and the second microelectronic package connection bond pad comprises forming a package interconnection material bump on its respective first microelectronic package connection bond pad, forming a package interconnection material bump on the second microelectronic package connection bond pad, and attaching the first microelectronic package interconnection material bump with the second microelectronic package interconnection material bump.

10. The method of claim 9, wherein forming the package interconnection material bump on its respective first microelectronic package connection bond pad, forming the package interconnection material bump on the second microelectronic package connection bond pad, and attaching the first microelectronic package interconnection material bump with the second microelectronic package interconnection material bump comprises forming a package interconnection solder bump on its respective first microelectronic package connection bond pad, forming the package interconnection solder bump on the second microelectronic package connection bond pad, and reflowing the first microelectronic package interconnection solder bump with the second microelectronic package interconnection solder bump.

11. The method of claim 8, further including disposing an encapsulation material between the first microelectronic package substrate first surface and the second microelectronic package substrate first surface.

12. The method of claim 8, wherein electrically connecting the first microelectronic device to the microelectronic package substrate first surface comprises electrically connecting the first microelectronic device to the first microelectronic package substrate first surface with a plurality of interconnects in a flip-chip configuration.

13. The method of claim 12, further including disposing a first underfill material between the first microelectronic package microelectronic device and the first microelectronic package substrate.

14. The method of claim 8, wherein electrically connecting the second microelectronic device to the microelectronic package substrate first surface comprises electrically connecting the second microelectronic device to the second microelectronic package substrate first surface with a plurality of interconnects in a flip-chip configuration.

15. The method of claim 14, further including disposing a second underfill material between the second microelectronic package microelectronic device and the second microelectronic package substrate.

16. The method of claim 8, wherein at least one of electrically connecting the first microelectronic device to the microelectronic package substrate first surface and electrically connecting the second microelectronic device to the microelectronic package substrate comprises at least one of electrically connecting the first microelectronic device to the first microelectronic package substrate first surface with a plurality of wirebonds and electrically connecting the second microelectronic device to the second microelectronic package substrate first surface with a plurality of wirebonds.

17. The method of claim 8, further comprising attaching a back surface of the first microelectronic package microelectronic device to a back surface of the second microelectronic package microelectronic device with an adhesive material.

18. The method of claim 8, wherein the first microelectronic package substrate includes a second surface and the second microelectronic package substrate includes a second surface, and further including forming a plurality of external bond pads in or on at least one of the first microelectronic package substrate second surface and the second microelectronic package substrate second surface.

19. A computing device, comprising: a board; and
a package-on-package stacked microelectronic structure attached to the board, wherein the package-on-package stacked microelectronic structure comprises:
a first microelectronic package, comprising a substrate having a first surface and at least one package connection bond pad formed on the microelectronic package substrate first surface, and having at least one microelectronic device electrically connected to the microelectronic package substrate first surface;
a second microelectronic package, comprising a substrate having a first surface and at least one package connection bond pad formed on the second microelectronic package substrate first surface, and having at least one microelectronic device electrically connected to the second microelectronic package substrate first surface, and having at least two microelectronic devices electrically connected to the second microelectronic package substrate second surface, the at least two microelectronic devices co-planar with one another on the second microelectronic package substrate second surface, and the at least two microelectronic devices electrically coupled to the at least one microelectronic device of the second microelectronic package by conductive routes through the second microelectronic package substrate, wherein a first of the conductive routes couples a first microelectronic device of the at least two microelectronic devices to a microelectronic device of the at least one microelectronic device, and a second of the conductive routes couples a second microelectronic device of the at least two microelectronic devices to the microelectronic device of the at least one microelectronic device; and
at least one package-to-package interconnection structure extending between the first microelectronic package connection bond pad and the second microelectronic package connection bond pad.

20. The computing device of claim 19, further including an encapsulation material disposed between the first microelectronic package substrate first surface and the second microelectronic package substrate first surface.

21. The computing device of claim 19, wherein at least one of the first microelectronic package microelectronic device and the second microelectronic package microelectronic device is attached to its respective substrate with a plurality of interconnects in a flip-chip configuration.

22. The computing device of claim 21, further including at least one of a first underfill material disposed between the first microelectronic package microelectronic device and the first microelectronic package substrate, and a second underfill material disposed between the second microelectronic package microelectronic device and the first microelectronic package substrate.

23. The computing device of claim 19, wherein at least one of the first microelectronic package microelectronic device and the second microelectronic package microelectronic device is attached to it respective substrate with a plurality of wirebonds.

24. The computing device of claim 19, wherein a back surface of the first microelectronic package microelectronic device is attached to a back surface of the second microelectronic package microelectronic device with an adhesive material.

25. The computing device of claim 19, wherein the first microelectronic package substrate includes a second surface and the second microelectronic package substrate includes a second surface, and further including a plurality of external bond pads in or on at least one of the first microelectronic package substrate second surface and the second microelectronic package substrate second surface.

* * * * *